US008225267B2

(12) United States Patent
Sekiguchi

(10) Patent No.: US 8,225,267 B2
(45) Date of Patent: Jul. 17, 2012

(54) METHOD AND APPARATUS FOR ANALYZING STRUCTURE OF COMPLEX MATERIAL LAYER, AND STORAGE MEDIUM STORING PROGRAM FOR CAUSING A COMPUTER TO EXECUTE THEREOF METHOD

(75) Inventor: Tomohisa Sekiguchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 204 days.

(21) Appl. No.: 12/659,399

(22) Filed: Mar. 8, 2010

(65) Prior Publication Data

US 2010/0242002 A1 Sep. 23, 2010

(30) Foreign Application Priority Data

Mar. 17, 2009 (JP) .................................. 2009-64895

(51) Int. Cl.
*G06F 17/50* (2006.01)

(52) U.S. Cl. ........ 716/136; 716/105; 716/106; 716/111; 716/118; 716/139

(58) Field of Classification Search .................. 716/105, 716/106, 110, 111, 118, 136, 139
See application file for complete search history.

(56) References Cited

U.S. PATENT DOCUMENTS

| 5,908,812 | A  | * | 6/1999  | Cotton et al. ................. 505/230 |
| 6,049,759 | A  | * | 4/2000  | Etgen .............................. 702/14 |
| 6,171,933 | B1 | * | 1/2001  | Xu et al. ....................... 438/462 |
| 6,383,666 | B1 | * | 5/2002  | Kim et al. ..................... 428/690 |
| 6,513,694 | B1 | * | 2/2003  | Xu et al. ...................... 225/96.5 |
| 7,809,659 | B1 | * | 10/2010 | Paiz ............................... 706/20 |
| 2009/0214615 | A1 | * | 8/2009  | Zhao ............................ 424/423 |

FOREIGN PATENT DOCUMENTS

JP         2004-13437        1/2004

* cited by examiner

*Primary Examiner* — Sun Lin
(74) *Attorney, Agent, or Firm* — McGinn IP Law Group, PLLC

(57) ABSTRACT

A structure analysis apparatus (1) for analyzing structure of a complex material layer containing a plurality of members (2a, 2b) for modeling layout data on a complex material layer, includes: an area setting portion (21) for setting an area to be modeled in the complex material layer; an area dividing portion (22) for dividing the area into a plurality of elements; an area computing portion (23) for calculating, based on an occupancy of each of the plurality of members (2a, 2b) in the area, the number of elements corresponding respectively to the plurality of members (2a, 2b); and an element placing portion (24) for generating a model of the complex material layer by placing the plurality of members (2a, 2b) respectively in the plurality of elements based on the number of the elements corresponding respectively to the plurality of members (2a, 2b).

6 Claims, 7 Drawing Sheets

METHOD AND APPARATUS FOR ANALYZING STRUCTURE OF COMPLEX MATERIAL LAYER, AND STORAGE MEDIUM STORING PROGRAM FOR CAUSING A COMPUTER TO EXECUTE THEREOF METHOD

BACKGROUND OF THE INVENTION

1. Field of the Invention

The present invention relates to a method and apparatus for analyzing a structure of a complex material layer, and a storage medium storing a program for causing a computer to execute the method.

2. Description of the Related Art

A complex material layer of a semiconductor package and a mounting substrate may be subjected to deformation such as warpage by heat. Thus, in order to enhance the reliability of a semiconductor device including a complex material layer, it is very important to analyze the degree of the deformation in the complex material layer may be deformed, in advance. The complex material layer may be analyzed by estimating the mechanical physical property values of each layer using a finite element method. However, a wiring layer included in the complex material layer has a very complicated shape in wiring. Therefore, if an attempt is made so as to model the wiring layer precisely, the model becomes too complicated. This causes inconvenience that it takes too much time to analyze a complex material layer including a precisely modeled wiring layer. In view of this, various methods of analyzing the structure of a complex material layer, which enhance efficiency in analysis, have been conceived.

JP 2004-013437 A (hereinafter, referred to as Patent Document 1) discloses a method of analyzing warpage of a substrate, capable of predicting the warpage of a substrate precisely, reflecting the difference due to the density of a wiring pattern. According to the method of analyzing warpage of a substrate, first, a plurality of elements in arbitrary shapes dividing the substrate are created based on model data representing the shape of the substrate. Then, the data on the wiring pattern to be formed on the substrate is compared with each element, to thereby calculate, for each element, the ratio at which the wiring pattern occupies the element. Then, based on the ratio for each element, at which the wiring pattern occupies the element, the mechanical physical property values are calculated for each element. Then, the warpage of the substrate is analyzed based on the mechanical physical property values for each element.

However, the inventor of the present invention has found the following problems. According to the analysis method disclosed in Patent Document 1, the physical property values of each element dividing the wiring pattern are calculated as a total obtained after the physical property values of a copper foil and the physical property values of an insulating material are prorated in accordance with the density (ratio of the copper foil) of the wiring pattern, for each element. The calculated physical property values are likely to become large in the case where the physical property values of each member vary largely, and hence, the calculated physical property values of an element may become those of properties that may not be obtained in reality. For example, an ordinary substance tends to have a small Young's modulus when a thermal expansion thereof is large, and tends to have a large Young's modulus when a thermal expansion thereof is small. In the case of copper and resin (solder resist), the thermal expansion of copper is small, whereas the Young's modulus thereof is large. On the other hand, the thermal expansion of resin is large, whereas the Young's modulus thereof is small. Accordingly, in the case where an element composed of copper and resin is analyzed, physical property values in which both the thermal expansion and the Young's modulus are large may be obtained. That is, when the method of Patent Document 1 is used, physical property values of properties that may not be obtained for an ordinary substance are obtained in each divided element, and hence, there arises a problem that the analysis results become substantially different from actually measured values.

SUMMARY OF THE INVENTION

The present invention provides a structure analysis apparatus for analyzing a structure of a complex material layer containing a plurality of members for modeling layout data on a complex material layer, which includes: an area setting portion for setting an area to be modeled in the complex material layer; an area dividing portion for dividing the area into a plurality of elements; an area computing portion for calculating, based on an occupancy of each of the plurality of members in the area, the number of elements corresponding respectively to the plurality of members; and an element placing portion for generating a model of the complex material layer by placing the plurality of members respectively in the plurality of elements, based on the number of the elements corresponding respectively to the plurality of members.

In the structure analysis apparatus, the area for modeling layout data is first set, and the area is divided into a plurality of elements. Then, based on the occupancy of the plurality of members in the area, the number of elements corresponding to the plurality of members is calculated. Further, a plurality of members are placed in each element based on the calculated number of elements, to thereby generate a model of a complex material layer.

According to the present invention, stress analysis values of a complex material layer having a layer containing a plurality of members may be efficiently calculated as precise values close to actually measured values.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention is now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, a structure analysis apparatus 1 according to an embodiment of the present invention is descried with reference to the accompanying drawings.

Figure 1:
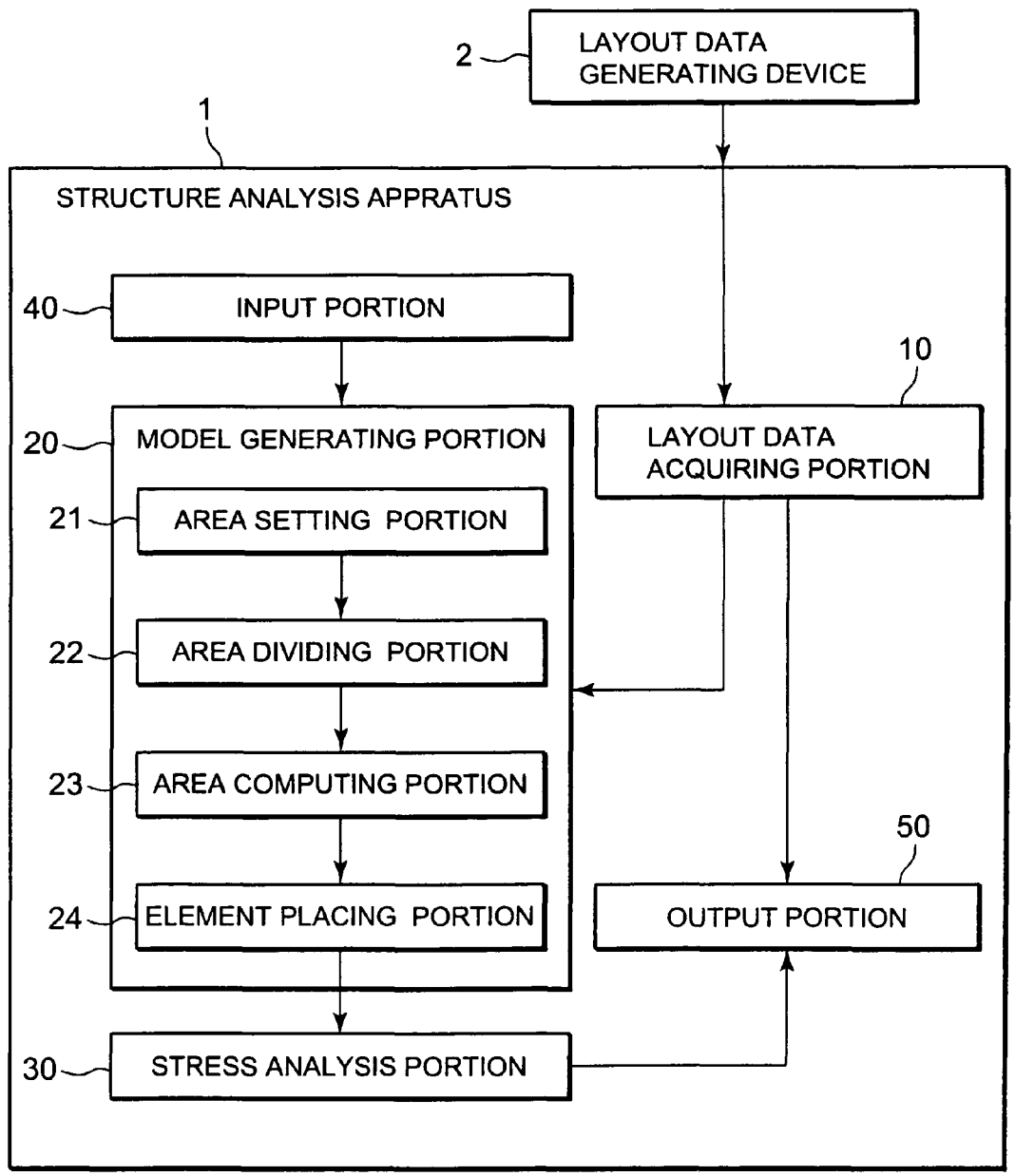
FIG. 1 is a block diagram illustrating an exemplary structure of a structure analysis apparatus 1 of the present invention.

FIG. 1 is a block diagram illustrating an exemplary structure of the structure analysis apparatus 1 of the present invention. Referring to FIG. 1, the structure analysis apparatus 1 is described. The structure analysis apparatus 1 acquires layout data on a wiring layer including a plurality of members such as a semiconductor package and a mounting substrate, generated by a layout data generating device 2, and performs structure analysis of a complex material layer including the wiring layer.

Figure 2:
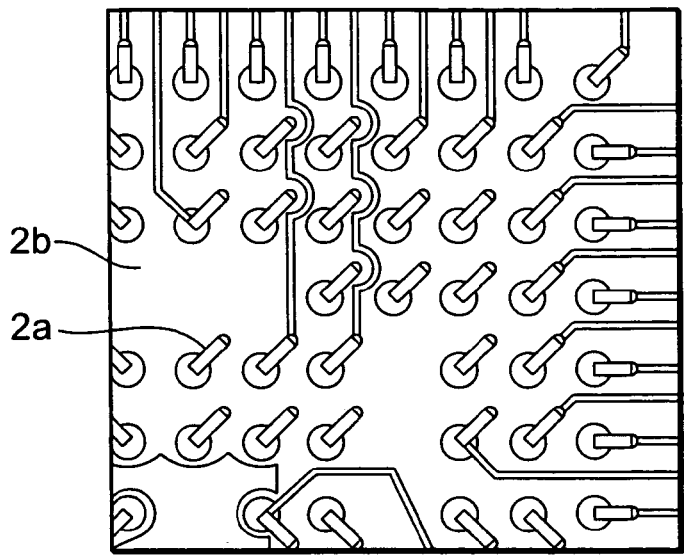
FIG. 2 is a plan view illustrating a part of layout data on a wiring layer, generated by a layout data generating device 2.

The layout data generating device 2 generates layout data on a wiring layer including a semiconductor package, a mounting substrate, and the like. The layout data generating device 2 may generate layout data on a wiring layer with a multilayered structure. FIG. 2 is a plan view illustrating a part of the layout data on the wiring layer generated by the layout data generating device 2. FIG. 2 illustrates layout data on an arbitrary layer of a plurality of layers included in the wiring layer. Referring to FIG. 2, the layout data includes a plurality of members, such as wiring 2a and an insulator 2b, which are included in the wiring layer, and contains positional information on each of the members.

The structure analysis apparatus 1 includes a layout data acquiring portion 10, a model generating portion 20, a stress analysis portion 30, an input portion 40, and an output portion 50.

The layout data acquiring portion 10 acquires layout data from the layout data generating device 2, and provides the layout data to the model generating portion 20 and to the output portion 50.

The model generating portion 20 acquires the layout data on the wiring layer from the layout data acquiring portion 10, and generates a model for analyzing the wiring layer. The model generating portion 20 provides the generated model to the stress analysis portion 30. The model generating portion 20 is described in detail. The model generating portion 20 includes an area setting portion 21, an area dividing portion 22, an area computing portion 23, and an element placing portion 24.

Figure 3:
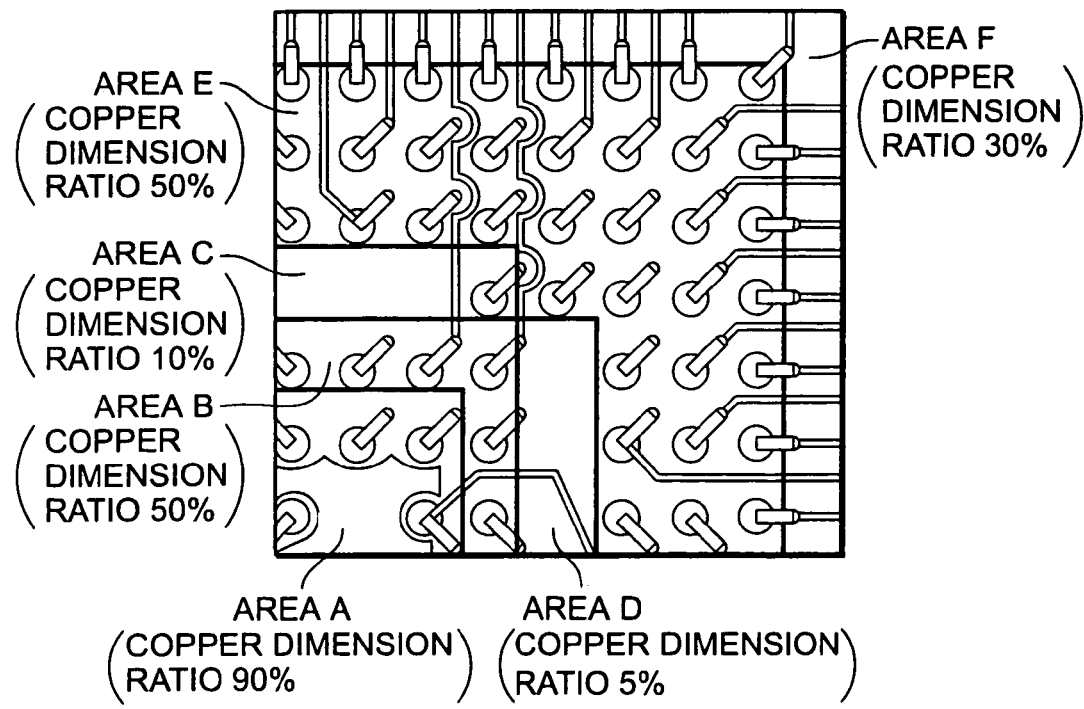
FIG. 3 is a diagram illustrating a plurality of areas set by an area setting portion 21 based on the layout data illustrated in FIG. 2.

The area setting portion 21 sets a plurality of areas for modeling the layout data on the wiring layer. The plurality of areas are designated by a user based on the density of wiring of the layout data. Each of the plurality of areas set by the area setting portion 21 serves as a constituent site for modeling the wiring layer. FIG. 3 illustrates a plurality of areas set by the area setting portion 21 based on the layout data illustrated in FIG. 2. The detail of how the areas are set by the area setting portion 21 is described with reference to FIG. 3. The user determines the density of wiring with reference to the layout data illustrated in FIG. 2. The user designates a range corresponding to, for example, an area A from an input portion 40, based on the density of the wiring. The area setting portion 21 acquires the range designated by the user, and sets the range as the area A of the constituent site of the model. The area setting portion 21 similarly sets an area B to an area F of constituent sites of the model, based on the user input. The area A illustrated in FIG. 3 has a high wiring density in the layout data. The area B has an intermediate wiring density. The areas C and D have very small wiring densities. The area E has an intermediate wiring density. The area F has a small wiring density. In this manner, the area setting portion 21 may set a range according to the density of the wiring of the layout data designated by the user, as a constituent site for modeling. The area setting portion 21 provides the plurality of set areas to the area dividing portion 22.

Figure 4A:
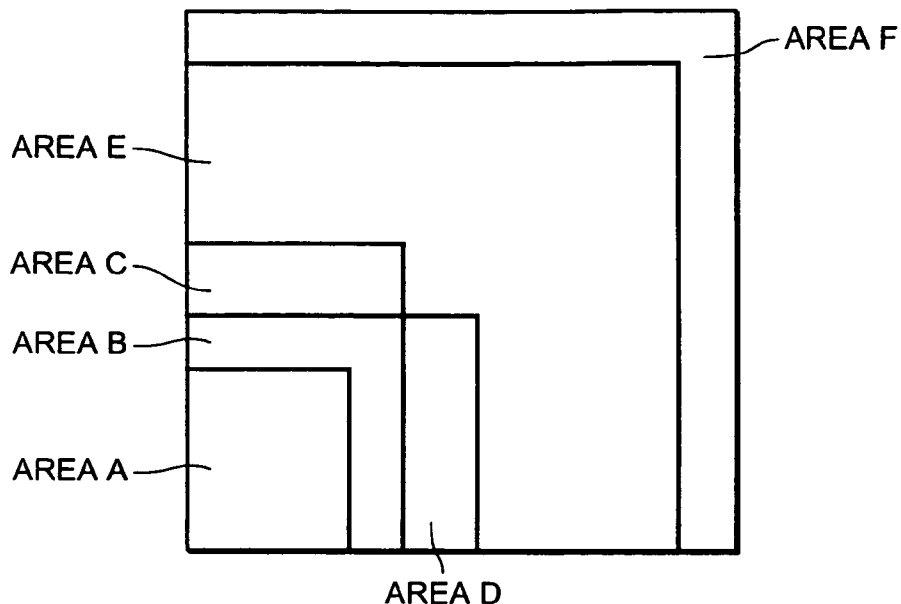
FIGS. 4A and 4B are diagrams illustrating how an area dividing portion 22 divides the plurality of areas obtained from the area setting portion 21 into a plurality of elements.
Figure 4B:
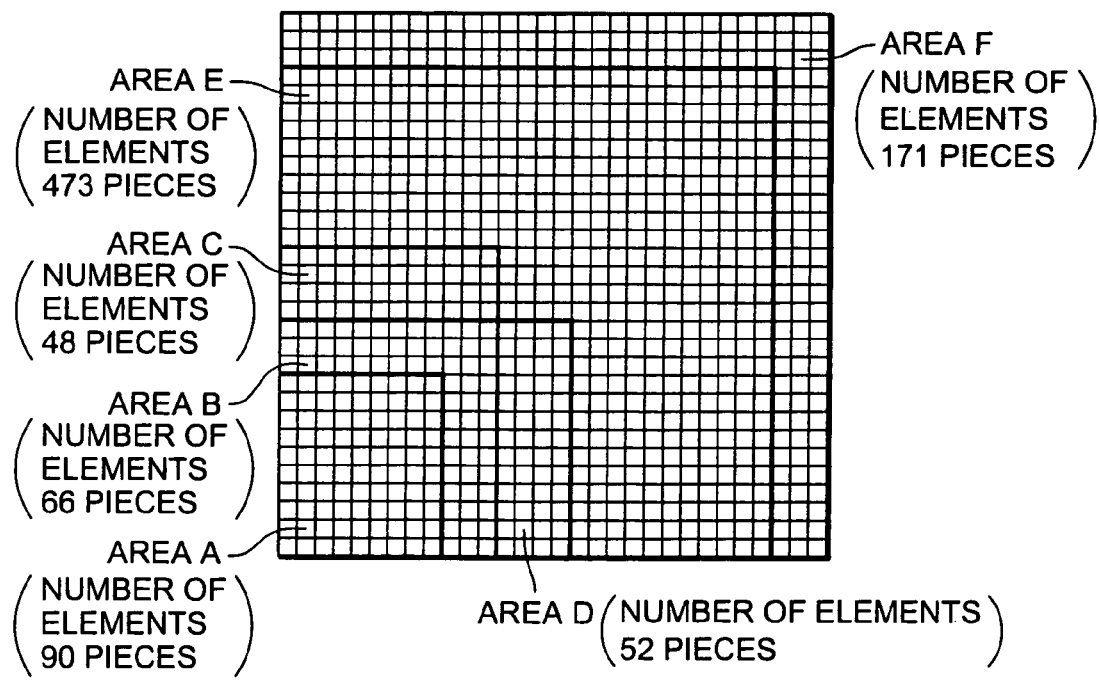

The area dividing portion 22 obtains a plurality of areas from the area setting portion 21. The area dividing portion 22 divides each of the plurality of areas into a plurality of elements. The area dividing portion 22 may change the dimension per element in each area in response to the user input. In other words, the user may decrease the dimension per element in the area which the user desires to model in detail, and may set the dimension per element in the area which is not required to be modeled in detail to be large. Further, the user may also change the shape of an element to an arbitrary shape such as a triangle or a rectangle. It is preferred that the area dividing portion 22 divides the elements in each area into the same dimension. Further, the area dividing portion 22 provides positional information and an ID for identifying each divided element to each element. FIGS. 4A and 4B illustrate how the area dividing portion 22 divides a plurality of areas obtained from the area setting portion 21 into a plurality of elements. With reference to FIGS. 4A and 4B, the detail of how the area dividing portion 22 divides the area into a plurality of elements is described. FIG. 4A illustrates a plurality of areas (areas A to F) obtained from the area setting portion 21. When the plurality of areas (areas A to F) are obtained, the area dividing portion 22 divides the plurality of areas into a plurality of elements, respectively (FIG. 4B). Although the area dividing portion 22 may arbitrarily change the dimension and shape of each of the elements in each area, the elements in each area of FIG. 4B are all divided into rectangles of the same dimensions. The area dividing portion 22 provides the plurality of divided areas to the area computing portion 23.

The area computing portion 23 obtains the plurality of areas divided into the plurality of elements. Further, the area computing portion 23 acquires layout data from a layout data acquiring portion 10. The area computing portion 23 calculates, with respect to each area, a wiring dimension ratio (occupancy of wiring) or a wiring dimension, based on a plurality of areas and the layout data.

The case where the area computing portion 23 calculates a wiring dimension ratio is described. Referring to FIG. 3, the area computing portion 23 calculates the wiring dimension ratio of the layout data with respect to the area A to be 90% based on the area A and the layout data. Similarly, the area computing portion 23 calculates the wiring dimension ratio of the layout data with respect to the area B to be 50%. Further, the area calculating portion 23 calculates the wiring dimension ratio of the area C to be 10%, the wiring dimension ratio of the area D to be 5%, the wiring dimension ratio of the area E to be 50%, and the wiring dimension ratio of the area F to be 30%.

The area computing portion 23 calculates the number of elements included in each area. Referring to FIG. 4B, the area computing portion 23 calculates the number of the elements included in the area A to be 90, the number of elements included in the area B to be 66, the number of elements included in the area C to be 48, the number of elements included in the area D to be 52, the number of elements included in the area E to be 473, and the number of elements included in the area F to be 171.

The area computing portion 23 multiplies the wiring dimension ratio of each area by the number of elements in each area to calculate the number of elements corresponding to the wiring, among the elements of each area. In the example illustrated in FIGS. 3, 4A, and 4B, the area computing portion 23 calculates the number of the elements to be used for the wiring in the area A to be 81, based on the wiring dimension ratio of the area A of 90% and the number of the elements of the area A of 90. Similarly, the area computing portion 23 calculates the number of the elements to be used for the wiring in the area B to be 33, based on the wiring dimension ratio of the area B of 50% and the number of the elements in the area B of 66. Further, the area computing portion 23 calculates the number of the elements to be used for the wiring in the area C to be 5 as an approximated value. Similarly, the area computing portion 23 subsequently calculates the number of the elements to be used for the wiring in the area D to be 3 as an approximated value, the number of the elements to be used for the wiring in the area E to be 236 as an approximated value, and the number of the elements to be used for the wiring in the area F to be 51 as an approximated value. The area computing portion 23 provides the calculated numbers of the elements to be used for the wiring, to the element placing portion 24.

Next, the case where the area computing portion 23 calculates a wiring dimension is described. The area computing portion 23 calculates a wiring dimension to be placed in each area, based on each area (areas A to F) and the wiring of the layout data. Further, the area computing portion 23 calculates a dimension per element in each area. It should be noted that the area dividing portion 22 may provide the dimension per element to the area computing portion 23. The area computing portion 23 provides the wiring dimension to be placed in each area and the dimension per element to the element placing portion 24.

Figure 5:
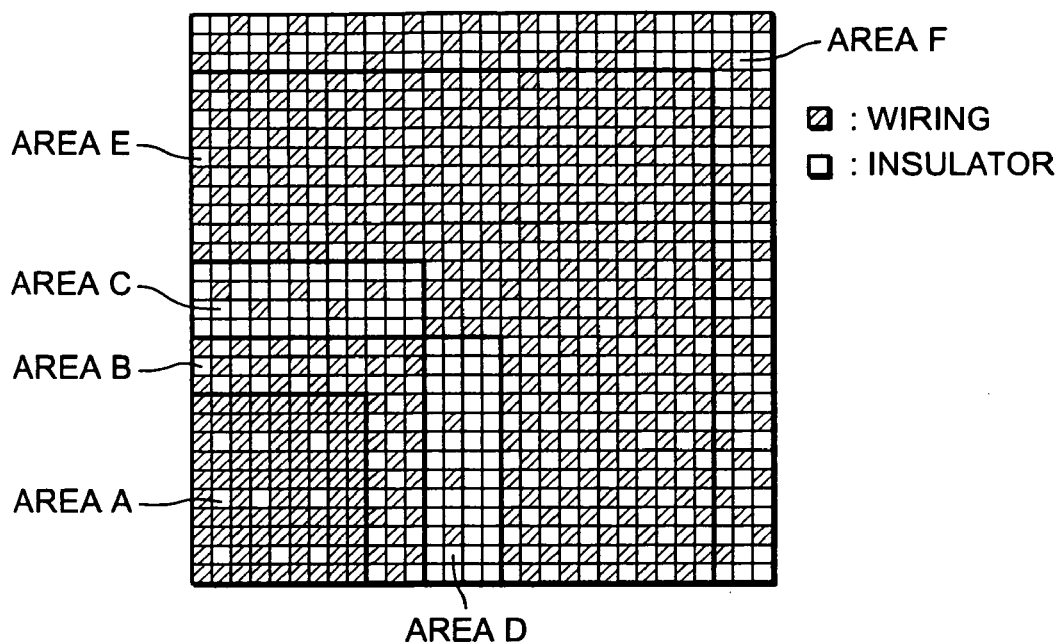
FIG. 5 is a diagram illustrating how an element placing portion 24 places elements of wiring in each area.

The element placing portion 24 obtains the number of the elements to be used for the wiring in each area or the wiring dimension to be placed in each area and the dimension per element, which are calculated by the area computing portion 23. In the case where the element placing portion 24 obtains the number of the elements to be used for the wiring in each area, the element placing portion 24 designates, at random, elements to be used for the wiring to the number thus obtained, among the elements in each area. In the case where the element placing portion 24 obtains the wiring dimension to be placed in the elements in each area and the dimension per element, the element placing portion 24 designates, at random, elements to be used for the wiring which sum up to the dimension thus obtained, based on the dimension per element so as to satisfy the wiring dimension of each area. FIG. 5 is a diagram illustrating how the element placing portion 24 places the elements of the wiring in each area. When the wiring is made of copper, the elements of copper are placed as the elements of the wiring. The elements which have no wiring placed therein are insulators. Each area in which the elements of the wiring and the elements of the insulators are placed as illustrated in FIG. 5 is a model for a wiring layer to be analyzed. The element placing portion 24 provides the generated model to the stress analysis portion 30.

The stress analysis portion 30 obtains the model from the element placing portion 24. The stress analysis portion 30 calculates stress analysis values of a complex material layer including the wiring layer, based on the physical property values (expansion ratio, Young's modulus, Poisson's ratio, and the like) of each element of the obtained model. The stress analysis values refer to a warped amount, a distorted amount, and the like, which are obtained as the result of the stress analysis. As the operation method conducted by the stress analysis portion 30, a well-known method may be used. For example, an analysis method by a finite element method may be used. The stress analysis portion 30 provides the calculated stress analysis value to the output portion 50.

The input portion 40 obtains a user input, and provides the input information to the model generating portion 20. It should be noted that the input portion 40 may provide the input information to each portion of the structure analysis apparatus 1 in addition to the model generating portion 20. The output portion 50 outputs various kinds of information related to the processing of the structure analysis apparatus 1, such as the layout data, the stress analysis values calculated by the stress analysis portion 30, and the like, in a manner that may be recognized by the user.

Figure 6:
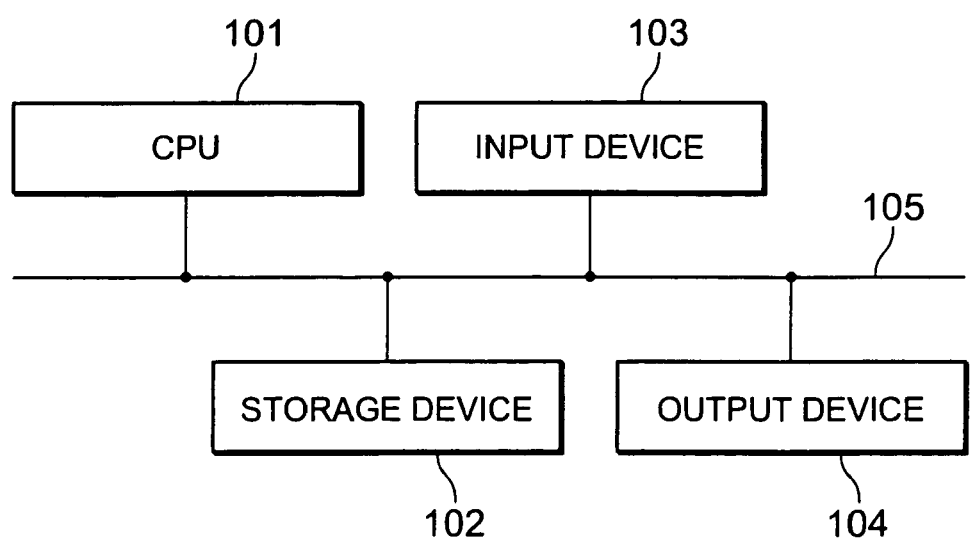
FIG. 6 is a block diagram illustrating a hardware structure example of the structure analysis apparatus 1 according to an embodiment of the present invention.

The structure analysis apparatus 1 according to the embodiment of the present invention may be implemented using a computer. FIG. 6 is a block diagram illustrating a hardware structure example of the structure analysis apparatus 1 according to the embodiment of the present invention. Referring to FIG. 6, the structure analysis apparatus 1 of the present invention includes a central processing unit (CPU) 101, a storage device 102, an input device 103, an output device 104, and a bus 105 connecting each of the devices.

The CPU 101 performs operation processing and control processing related to the structure analysis apparatus 1 of the present invention, stored in the storage device 102. The storage device 102 is a device such as a hard disk or a memory, which records information according to the present invention. The storage device 102 stores a program read from a computer-readable storage medium such as a compact disc-read-only memory (CD-ROM) or a digital versatile disc (DVD), a signal and a program input from the input device 103, and the processing results of the CPU 101. The input device 103 is a device such as a mouse, a keyboard, or a microphone, which allows the user to input a command and a signal. The output device 104 is a device such as a display or a speaker, which allows the user to recognize the output results. It should be noted that the present invention is not limited to the hardware structure example illustrated in FIG. 6, and each portion may be implemented by using hardware and software singly or in combination thereof.

Figure 7:
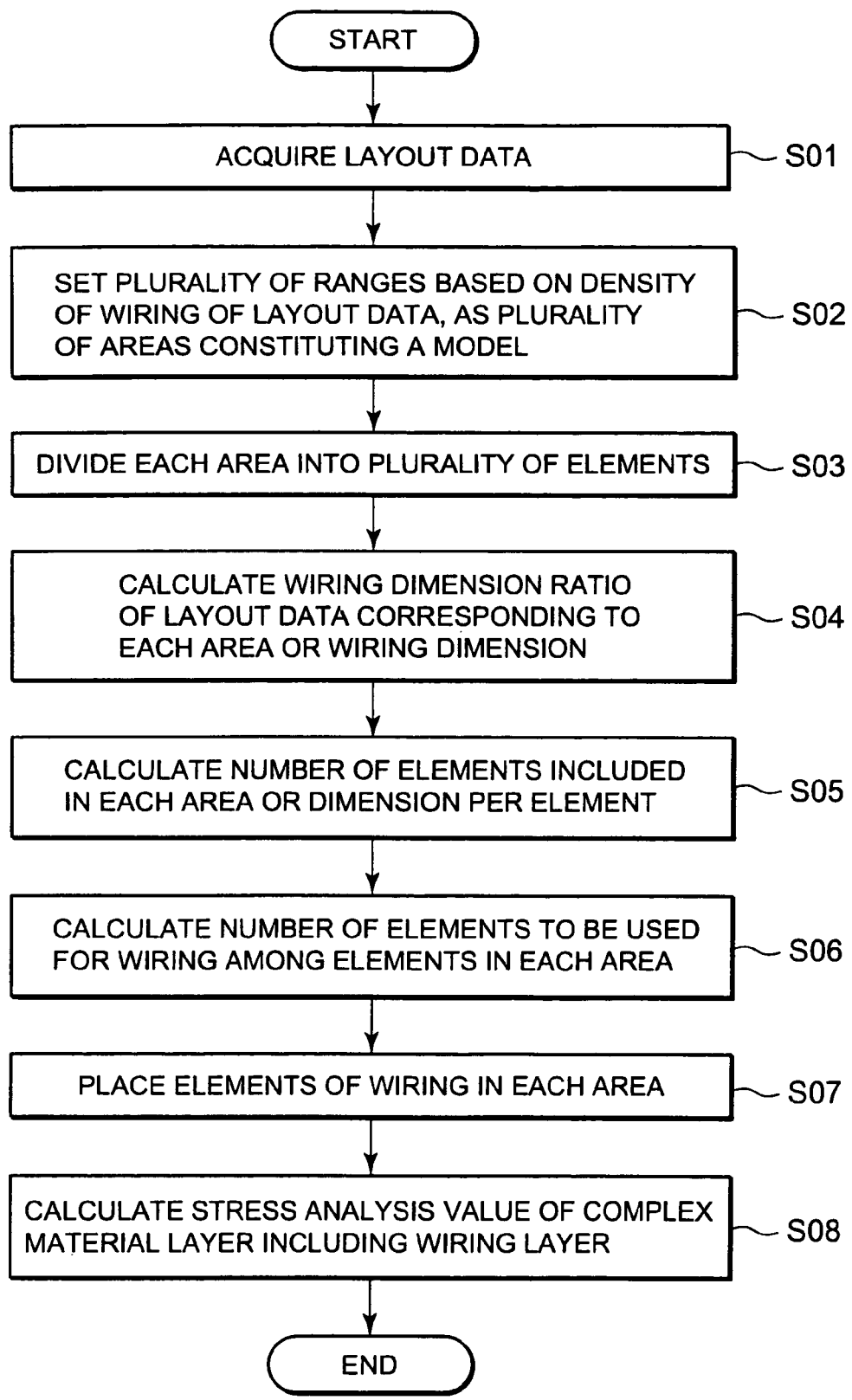
FIG. 7 is a flowchart illustrating a processing operation of the structure analysis apparatus 1 according to the embodiment of the present invention.

FIG. 7 is a flowchart illustrating a processing operation of the structure analysis apparatus 1 according to the embodiment of the present invention. Referring to FIG. 7, the processing operation according to the embodiment of the present invention is described. In the flowchart, the processing method of modeling a wiring layer based on the layout data on the wiring layer illustrated in FIG. 2 is described.

The layout data acquiring portion 10 acquires the layout data (see FIG. 2) on the wiring layer generated by the layout data generating device 2, and provides the layout data to the model generating portion 20. Further, the layout data acquiring portion 10 provides the acquired layout data to the output portion 50. The output portion 50 displays the layout data in a manner that may be recognized by the user (Step S01).

The user determines the density of the wiring referring to the displayed layout data of FIG. 2. The user designates the range with a high wiring density, from the input portion 40. The area setting portion 21 obtains the range designated by the user, and sets the range as the area A to be a constituent site of a model (see FIG. 3). The area setting portion 21 similarly sets the adjacent areas B to F with different wiring densities, based on the user input. That is, the area setting portion 21 sets a plurality of ranges designated by the user based on the density of the wiring of the layout data, as a plurality of areas constituting the model. The area setting portion 21 provides the plurality of set areas to the area diving portion 22 (Step S02).

The area dividing portion 22 obtains a plurality of areas (areas A to F) from the area setting portion 21 (see FIG. 4A). The area dividing portion 22 divides each area into a plurality of elements (see FIG. 4B). FIGS. 4A and 4B illustrate a case where the dimension per element and the shape are set by the user, and the area dividing portion 22 divides the elements into the same dimension. The area dividing portion 22 provides a plurality of divided areas to the area computing portion 23 (Step S03).

The area computing portion 23 obtains the plurality of areas divided into the plurality of elements. Further, the area computing portion 23 acquires layout data from the layout data acquiring portion 10. The area computing portion 23 calculates, with respect to each area, a wiring dimension ratio or a wiring dimension. Referring to FIG. 3, the area computing portion 23 calculates the wiring dimension ratio of the layout data with respect to the area A to be 90%. Similarly, the area computing portion 23 calculates the wiring dimension ratio of the layout data with respect to the area B to be 50%. Further, the area calculating portion 23 calculates the wiring dimension ratio of the area C to be 10%, the wiring dimension ratio of the area D to be 5%, the wiring dimension ratio of the area E to be 50%, and the wiring dimension ratio of the area F to be 30%. Alternatively, the area computing portion 23 may calculate wiring dimensions of the areas A to E (Step S04).

The area computing portion 23 calculates the number of elements included in each area. Referring to FIG. 4B, the area computing portion 23 calculates the number of the elements included in the area A to be 90, the number of elements included in the area B to be 66, the number of elements included in the area C to be 48, the number of elements included in the area D to be 52, the number of elements included in the area E to be 473, and the number of elements included in the area F to be 171. Alternatively, in the case of calculating a wiring dimension of each area, the area computing portion 23 calculates a dimension per element in each area (Step S05).

The area computing portion 23 calculates the number of elements to be used for the wiring, among the elements of each area. Referring to FIGS. 3, 4A, and 4B, the area computing portion 23 calculates, the number of the elements to be used for the wiring in the area A to be 81 based on the wiring dimension ratio of the area A of 90% and the number of the elements of the area A of 90. Similarly, the area computing portion 23 calculates the number of the elements to be used for the wiring in the area B to be 33, based on the wiring dimension ratio of the area B of 50% and the number of the elements in the area B of 66. Further, the area computing portion 23 calculates the number of the elements to be used for the wiring in the area C to be 5 as an approximated value. Similarly, the area computing portion 23 subsequently calculates the number of the elements to be used for the wiring in the area D to be 3 as an approximated value, the number of the elements to be used for the wiring in the area E to be 236 as an approximated value, and the number of the elements to be used for the wiring in the area F to be 51 as an approximated value. The area computing portion 23 provides the calculated numbers of the elements to be used for the wiring to the element placing portion 24. In the case where the area computing portion 23 calculates the wiring dimension of each area and the dimension per element in each area, the area computing portion 23 provides the wiring dimension and the dimension per element to the element placing portion 24 (Step S06).

The element placing portion 24 obtains the number of the elements to be used for the wiring of each area calculated by the area computing portion 23. As illustrated in FIG. 5, the element placing portion 24 places elements (for example, copper) of the wiring in each area at random to generate a model. In the elements which have no wiring placed therein, insulators are placed. In the case where the wiring dimension of each area and the dimension per element are obtained, the element placing portion 24 places the elements of the wiring at random so that the dimensions of the elements thus placed become equal to the wiring dimension, to thereby generate a model. The element placing portion 24 provides the formed model to the stress analysis portion 30 (Step S07).

The stress analysis portion 30 obtains the model from the element placing portion 24. The stress analysis portion 30 calculates stress analysis values of a complex material layer including the wiring layer, based on the physical property values (expansion ratio, Young's modulus, Poisson's ratio, and the like) of each element of the obtained model. The stress analysis values may be represented by, for example, warpage of a complex material under various temperature environments. As the operation method conducted by the stress analysis portion 30, a well-known method may be used. For example, an analysis method by a finite element method may be used. The stress analysis portion 30 provides the calculated stress analysis value to the output portion 50. The output portion '50 outputs the stress analysis value in a manner that may be recognized by the user (Step S08).

Figure 8:
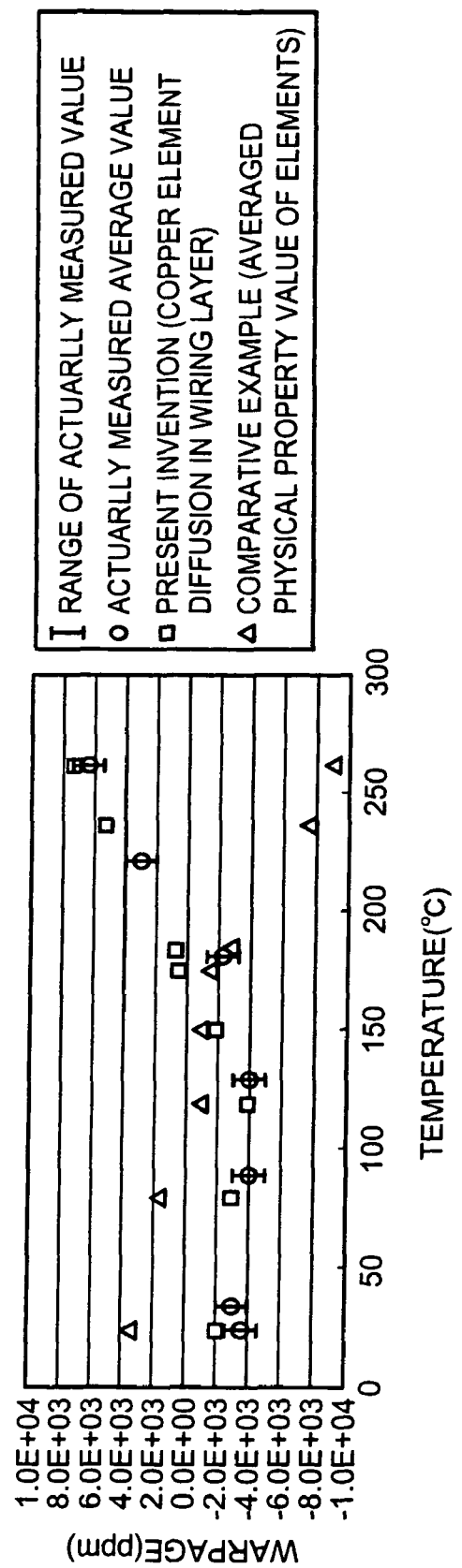
FIG. 8 illustrates an example of structure analysis results of a complex material layer, obtained by the structure analysis apparatus 1 of the present invention.

FIG. 8 is a diagram illustrating exemplary structure analysis results of the complex material layer analyzed by the structure analysis apparatus 1 of the present invention. Referring to FIG. 8, a horizontal axis represents a temperature (° C.) set to a complex material layer and a vertical axis represents warpage (ppm) of the complex material layer. The value of the warpage (ppm) on the vertical axis represents the ratio of a height of the warpage in the thickness direction with respect to the length of the width of the complex material layer. The positive values on the vertical axis represent a case where the warpage of the complex material layer is in a convex shape, and the minus values represent a case where the warpage of the complex material layer is in a concave shape. In FIG. 8, vertical bars each indicate a range of an actually measured value of warpage of the complex material layer at each temperature, and circle marks each indicate an average value of each of the actually measured values. The values indicated by rectangle marks in FIG. 8 each are a value of warpage obtained by modeling and analyzing the same complex material layer by the structure analysis apparatus 1 of the present invention. Further, triangle marks in FIG. 8 each indicate a value of warpage obtained by modeling and analyzing the same complex material layer based on the method pursuant to the method disclosed in Patent Document 1 as a comparative example.

Figure 9A:
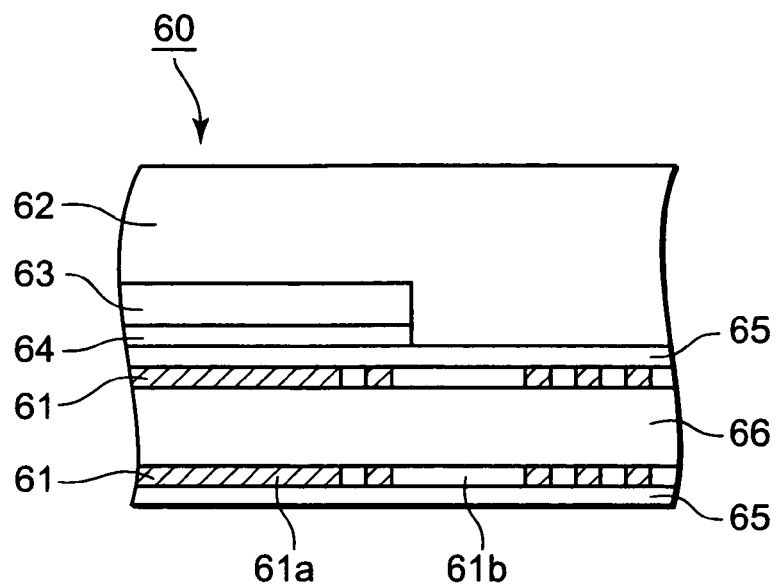
FIG. 9A illustrates a partial cross-section of a model 60 of a complex material layer according to the structure analysis apparatus 1 of the present invention.
Figure 9B:
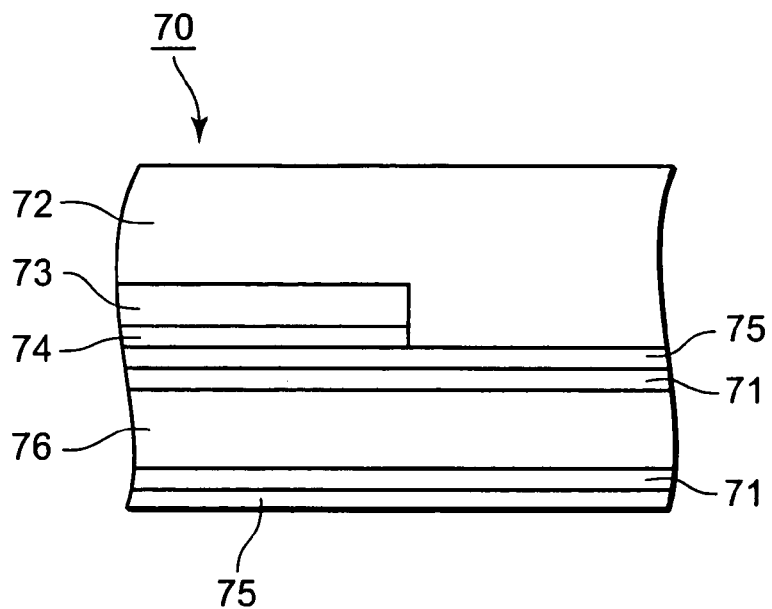
FIG. 9B illustrates a partial cross-section of a model 70 of a complex material layer as a comparison example.

A model 60 of a complex material layer modeled based on the structure analysis apparatus 1 of the present invention and a model 70 (as a comparison example) based on the idea of the method disclosed in Patent Document 1, which are illustrated in FIGS. 9A and 9B, respectively, are described. FIGS. 9A and 9B are diagrams illustrating cross-sections of the model 60 of the complex material layer according to the structure analysis apparatus 1 of the present invention and the model 70 of the complex material layer based on the idea of the method disclosed in Patent Document 1, respectively. Referring to FIG. 9A, the model 60 of the complex material layer of the present invention is described. The model 60 of the complex material layer includes a wiring layer model 61, a sealing resin model 62, a chip model 63, a mount material model 64, a resist material model 65, and a core layer model 66. The wiring layer model 61 is a model of a wiring layer generated based on the model generating portion 20 of the present invention. That is, the wiring layer model 61 is a model in which copper 61a and an insulator 61b of the wiring layer are diffused. The sealing resin model 62, the chip model 63, the mount material model 64, the resist material model 65, and the core layer model 66 are obtained by modeling the respective members, and well-known methods may be used as the modeling method.

Referring to FIG. 9B, the model 70 as a comparison example is explained as follows. The model 70 of the complex material layer includes a wiring layer model 71, a sealing resin model 72, a chip model 73, a mount material model 74, a resist material model 75, and a core layer model 76. The wiring layer model 71 is obtained by calculating the physical property values of the members included for each element as a total after the proration. Other than the wiring layer model 71, the sealing resin model 72 is similar to the sealing resin model 62 of FIG. 9A. Similarly, the chip model 73 is similar to the chip model 63, the mount material model 74 is similar to the mount material model 64, the resist material model 75 is similar to the resist material model 65, and the core layer model 76 is similar to the core layer model 66. Accordingly, the model 60 of the complex material layer is similar to the model 70 of the complex material layer, except that the wiring layer model 61 is different from the wiring layer model 71.

Referring to FIG. 8, it is illustrated that the analysis results based on the structure analysis apparatus 1 of the present invention are closer to the actually measured values, compared with the analysis results based on the method pursuant to the method disclosed in Patent Document 1. That is, values closer to actually measured values may be obtained by directly diffusing the physical property values of the wiring in each element of the wiring layer.

In this specification, the example has been described in which the layout data on the wiring layer includes two members, namely, the wiring 2a and the insulator 2b. However, the present invention is similarly applicable to a wiring layer containing at least three members and a complex material layer including a wiring layer containing at least three members.

As described above, the structure analysis apparatus 1 of the present invention may calculate stress analysis values of a complex material layer having a layer containing a plurality of members that may not be modeled in detail as precise values closer to actually measured values, without increasing an analysis time.

It is apparent that the present invention is not limited to the above embodiments, and the embodiments can be modified and changed as appropriate within the scope of the technical concept of the present invention.

What is claimed is:

1. A structure analysis apparatus for analyzing a structure of a complex material layer containing a plurality of members for modeling layout data on the complex material layer, comprising:
    an area setting portion for setting an area to be modeled in the complex material layer;
    an area dividing portion for dividing the area into a plurality of elements;
    an area computing portion for calculating, based on an occupancy of each of the plurality of members in the area, a number of elements corresponding respectively to each of the plurality of members; and
    an element placing portion for generating a model of the complex material layer by placing each of the plurality of members respectively in each of the plurality of elements, based on the number of elements corresponding respectively to each of the plurality of members.

2. The structure analysis apparatus according to claim 1, wherein the area computing portion calculates the number of elements corresponding respectively to each of the plurality of members, based on the occupancy of each of the plurality of members and a number of elements in the divided area.

3. The structure analysis apparatus according to claim 1, wherein the element placing portion generates the model of the complex material layer by placing the plurality of members respectively in the plurality of elements at random.

4. The structure analysis apparatus according to claim 1, further comprising a stress analysis portion that calculates a stress analysis value of the complex material layer, based on the model of the complex material layer.

5. The structure analysis apparatus according to claim 4, wherein the stress analysis value is warpage of the complex material layer.

6. A storage medium storing a program for causing a computer to execute a method comprising:
    acquiring layout data on a complex material layer containing a plurality of members;
    setting an area for modeling the layout data, based on a user input;
    dividing the area into a plurality of elements;
    calculating, based on an occupancy of each of the plurality of members in the area, a number of elements corresponding respectively to each of the plurality of members; and
    generating a model of the complex material layer by placing the plurality of members respectively in the plurality of, elements, based on the number of elements corresponding respectively to each of the plurality of members.

* * * * *